United States Patent
Richard et al.

[11] Patent Number: 6,144,203
[45] Date of Patent: Nov. 7, 2000

[54] COIL HARNESS ASSEMBLY FOR INTERVENTIONAL MRI APPLICATION

[75] Inventors: Mark A. Richard, South Euclid; Donald W. Kormos, Parma, both of Ohio

[73] Assignee: Hitachi Medical Corporation, Japan

[21] Appl. No.: 09/198,017

[22] Filed: Nov. 23, 1998

Related U.S. Application Data

[60] Provisional application No. 60/066,980, Nov. 28, 1997.

[51] Int. Cl.⁷ .................................................. G01V 3/00
[52] U.S. Cl. ......................................... 324/318; 600/422
[58] Field of Search .................................. 324/318, 322, 324/300, 307, 309, 306; 600/422, 423

[56] References Cited

U.S. PATENT DOCUMENTS

| | | | |
|---|---|---|---|
| 4,692,705 | 9/1987 | Hayes | 324/318 |
| 4,897,604 | 1/1990 | Carlson et al. | 324/318 |
| 5,144,239 | 9/1992 | Oppelt et al. | 324/318 |
| 5,327,898 | 7/1994 | Yoshino et al. | 128/653.5 |
| 5,457,386 | 10/1995 | Matsunaga et al. | 324/318 |
| 5,559,434 | 9/1996 | Takahashi et al. | 324/318 |
| 5,663,645 | 9/1997 | Kaufman et al. | 324/318 |
| 5,682,098 | 10/1997 | Vij | 324/318 |
| 5,804,969 | 9/1998 | Lian et al. | 324/318 |
| 5,945,827 | 8/1999 | Gronauer et al. | 324/318 |

FOREIGN PATENT DOCUMENTS 19618989  11/1997  Germany.

OTHER PUBLICATIONS

Advertising Literature entitled "*MRP Magnetic Resonance Imaging Systems*" by Hitachi Medical Systems America, Inc., 1994.

*Primary Examiner*—Louis Arana
*Attorney, Agent, or Firm*—Thompson Hine & Flory LLP

[57] ABSTRACT

A coil assembly for use in MRI imaging includes a harness having a base. First and second arm members extend from a first side of the base and above and over the base and third and fourth arm members extend from a second side of the base and above and over the base. A first cross member extends between the first arm member and the second arm member and a second cross member extends between the third arm member and the fourth arm member. An end of the first arm member is aligned with and detachably connected to an end of the third arm member and an end of the second arm member is aligned with and detachably connected to an end of the fourth arm member. First and second coil members each extend along the harness. The first coil member may be a saddle coil and the second coil member may be a solenoid coil configured to establish a quadrature arrangement.

20 Claims, 8 Drawing Sheets

COIL HARNESS ASSEMBLY FOR INTERVENTIONAL MRI APPLICATION

PRIORITY CLAIM

This application claims the benefit of provisional application Ser. No. 60/066,980, filed Nov. 28, 1997.

BACKGROUND

The present invention relates generally to Magnetic Resonance Imaging, and more particularly, to a coil harness assembly for use in Magnetic Resonance Imaging.

Magnetic Resonance Imaging ("MRI") is a well-known procedure for obtaining detailed, two- and three-dimensional images of a patient based upon nuclear magnetic resonance ("NMR") principles. MRI is well suited for the imaging of soft tissues, and has been used primarily for diagnosing internal injuries or other medical ailments. A typical MRI system will generally include a magnet capable of producing a very strong homogenous magnetic field, sized to cover or surround a portion of a patient's anatomy; a radio frequency ("RF") transmitter and receiver system, including a receiver coil which surrounds the portion of the patient's anatomy under study; a magnetic gradient system to localize in space a particular portion of the patient's anatomy under study; and a computer processing/imaging system for receiving the signals from the receiver coil and for processing the signals into interpretable data, such as visual images for viewing by the physician or MRI attendant. Additional information regarding MRI technology and equipment can be found in Van Nostrand's Scientific Encyclopedia, Eighth Edition, pp. 2198–2201 and U.S. Department. of Heath and Human Services, "A Primer on Medical Device Interactions with Magnetic Resonance Imaging Systems," Feb. 7, 1997. The general principles and associated equipment used in MRI is well-known, and as such, additional disclosure is not necessary.

The advent of "open" MRI systems has provided patients with a more comfortable examination process and has also provided the MRI attendants and physicians access to the patient while a portion of that patient is being viewed by the MRI system. Examples of such open MR systems are the AIRIS® and AIRIS® II systems, commercially available from Hitachi Medical Systems America, Inc. Open MRI systems allow for physicians and other MRI attendants to perform an interventional surgery or other therapeutic procedures on the patient while the MRI system is producing images.

Open MRI systems also facilitate "MR Fluoroscopy" which combines near realtime signal acquisition, image reconstitution and image display with such interventional procedures. Accordingly, by utilizing MR Fluoroscopy, the physician will be able to monitor, substantially in real-time (approximately one image per second), a two- or three-dimensional image of the anatomy while performing a medical procedure on that anatomy. For example, if the physician wishes to insert an MR compatible tool, such as a needle or endoscope for example, into a particular organ, while missing other organs, the physician will be able to monitor the path of the endoscope, internally, by viewing the MRI image on a viewing screen.

Conventional coils for use with interventional MRI procedures typically include single-loop solenoid coil designs. Since these coils are very narrow (3–5 centimeters in width), the coils are inherently open and allow a large area for patient access. A disadvantage with such single-loop solenoid coils is that the types of interventional procedures performed with such a coil is limited. This is because the single loop solenoid coils tend to have an undesirable signal to noise ratio; and further, they do not provide a relatively large volume of coverage. Accordingly, such a single loop solenoid coil would not be desired in an interventional procedure where an endoscopic instrument will enter into the patient's body at an oblique angle, for example.

Quadrature coil ("QD") arrangements provide a desirable signal to noise ratio. However, a disadvantage of using such QD arrangements in interventional procedures is that the coil harnesses for housing the coils and for positioning the coils about the portion of the patient being examined often prevent direct access to that portion of the patient by the physician. For example, a conventional spine/body coil harness for a QD arrangement includes a substantially rectangular base with an imperforate coil flap extending laterally from each side thereof. The two flaps wrap about the body of the patient and meet above the patient to form a continuous, imperforate loop about the patient. Accordingly, because these flaps substantially enclose the portion of the patient's anatomy being examined, interventional access to this portion of the patient is limited.

Accordingly, there is a need to provide a QD harness that has been modified to provide an optimized access to the patient during the MRI viewing process, and in particular, during MR Fluoroscopy.

SUMMARY

The present invention provides a coil harness for a quadrature coil arrangement which substantially optimizes access to the portion of the patient's anatomy being viewed during the MRI viewing process. In one aspect of the present invention, the quadrature coil arrangement includes a two-turn selonoid coil and a saddle coil. The two-turn solenoid coil is oriented such that the axis of its loops are substantially parallel to the patient axis. The saddle coil is oriented such that the axis of its loops are substantially perpendicular to the patient axis. The solenoid coil and the saddle coil are housed within a casing which includes a rectangular base, two pairs of substantially parallel, flexible arms extending laterally there from, where each of the arms have a coupling mounted to the ends thereof so that the arms can be coupled together to form loops; and a pair of cross bars, each cross bar extending between a respective pair of parallel arms.

The parallel flexible arms, and the loops formed by coupling the ends of one pair to another, are axially spaced apart from each other with a substantially large gap therebetween, which is preferably between 15–25 centimeters. Accordingly, the QD coil harness of the present invention, when in an operational state, provides an opening on each side of the harness, each opening extending nearly 150° from the base around the harness between the two flexible arms. These openings provide access to the patient during MR Fluoroscopy procedures such as spinal procedures, as well as other interventional procedures.

In another aspect of the present invention a coil assembly for use in MRI imaging includes a harness including a base. First and second arm members extend from a first side of the base and above and over the base and third and fourth arm members extend from a second side of the base and above and over the base. A first cross member extends between the first arm member and the second arm member and a second cross member extends between the third arm member and the fourth arm member. An end of the first arm member is aligned with and detachably connected to an end of the third arm member and an end of the second arm member is aligned with and detachably connected to an end of the fourth arm member. First and second coil members each extend along the harness.

DETAILED DESCRIPTION

Figure 1:
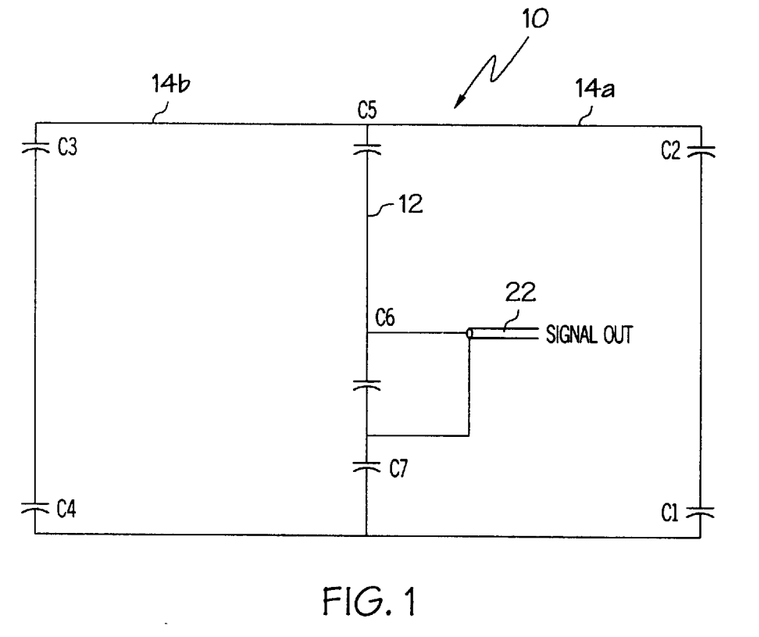
FIG. 1 provides a schematic representation of the saddle coil of the quadrature coil arrangement provided by one aspect of the present invention.
Figure 2:
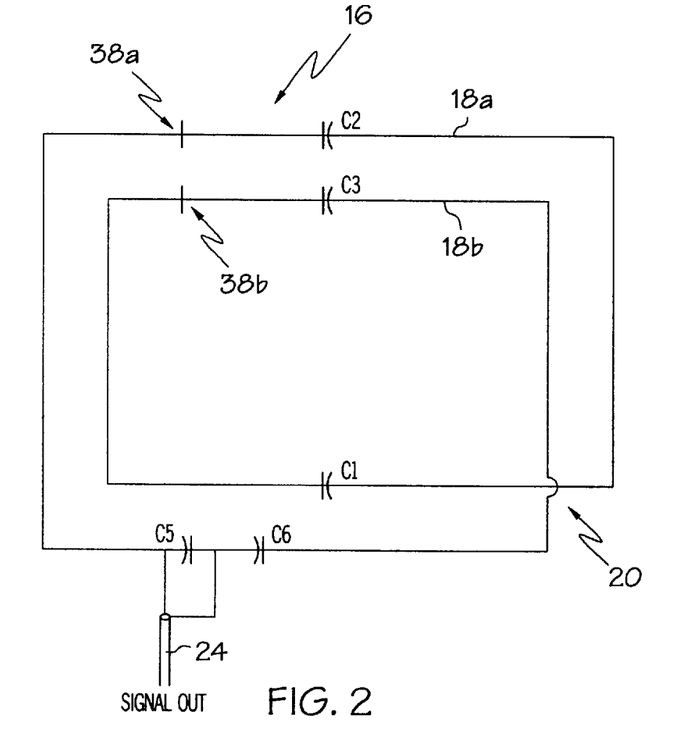
FIG. 2 provides a schematic representation of the solenoid coil of the quadrature coil arrangement.

As shown in FIGS. 1 and 2, in one embodiment of the invention a saddle coil and solenoid coil are utilized. The saddle coil 10 includes a base or common segment 12 and a pair of wing segments 14a, 14b coupled in parallel to the base segment 12. The two-turn solenoid coil 16 is a single coil twisted to form two loops 18a, 18b which overlap at point 20.

Figure 3:
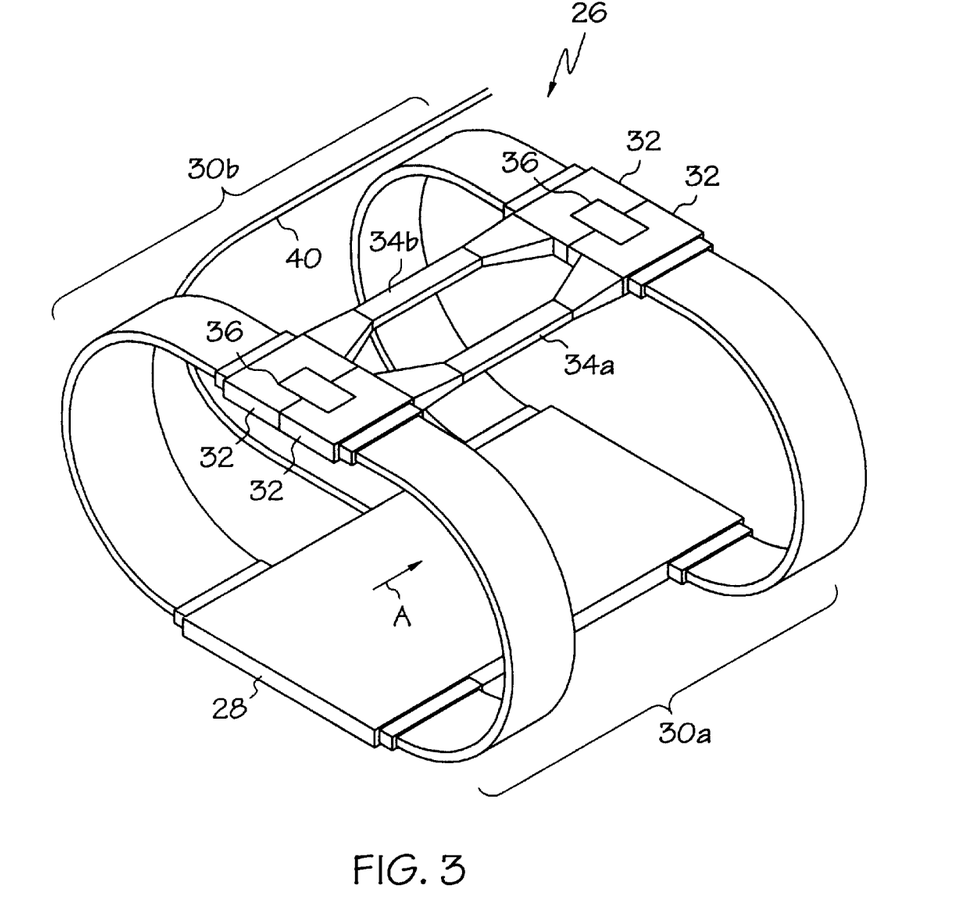
FIG. 3 provides a perspective view of a harness according to another aspect of the present invention with its two pairs of parallel arms connected in an operational state.

Each of the saddle coil 10 and two-turn solenoid coil 16 include a signal-out port 22, 24, respectively. Each of the coils may include a plurality of capacitors chosen so that the inherent inductance in the coils is cancelled out by these capacitors. Each of the coils are tuned to the frequency of operation of the MRI system. The frequency of operation is defined by the strength of the static magnetic field in units of Tesla, multiplied by the gyromagnetic ratio, which for protons is approximately 42.6 MHZ per Tesla. Thus, for the AIRIS system (mentioned above) with its 0.3 T magnet, the frequency of operation is approximately 12.7 MHz. A coil without capacitors will only have inductance (and resistance inherent in the conductors). The coil is tuned to resonance by using the formula:

$$f = 1/(2\pi\sqrt{(LC)})$$

where L is the inductance of the coil and C is the capacitance of the added capacitors. Usually, though, more than one capacitor is placed in series with the coil. Then the total capacitance is calculated as $1/C\ total = 1/C1 + 1/C2 + \ldots$ As shown in FIG. 3, coil harness 26 for housing the saddle coil and two-turn solenoid coil of the quadrature coil arrangement includes a rectangular base 28 having sides and ends respectively. Two opposing pairs of substantially parallel, flexible arms 30a, 30b extend laterally from the sides of the base 28 and generally above and over the base. Each of the arms has a coupling mechanism 32 mounted to the ends thereof so that the opposing, aligned arms can be detachably coupled together to form loops. An axis A of the harness is defined by a line extending transverse the ends of the base and extends generally centrally through the loops formed by the interconnected arms. A cross bar 34a, 34b extends between each respective pair of arms, and preferably between the coupling mechanisms 32 of the arms. The coil harness 26 also includes latch mechanisms 36 for detachably connecting the opposing pairs of flexible arms together during an MRI procedure. A variety of latch mechanisms may be utilized including hook and latch means, straps and plastic buckles or clip connectors, or plastic snap connectors to name just a few.

Each of the arms are preferably spaced apart from each other with a substantially large gap there between, which is preferably 15 to 25 cm. When the opposing pairs of flexible arms are coupled together, the cross bars 34a, 34b may be spaced apart from each other as shown to provide a gap there between, parallel to the patient or harness axis A, which is about 50–70 mm. Alternatively, the cross bars 34a, 34b may be positioned adjacent each other providing no significant gap there between. Accordingly, the coil harness 26 of the present invention, when in an operational state (flexible arms detachably coupled together), provides an opening on each side thereof extending nearly 150° around its circumference from the side of the base 28 to the cross bar 34a, 34b. An opening at the top of the patient between the cross bars may also be provided if desired. It is recognized that the two side openings could vary depending upon the configuration of the base and positioning of the cross bars, it being preferred that each cross bar be circumferentially spaced at least 125° from the closest side portion of the base 28. However, circumferential spacings of less than 125° are considered to be within the scope of the present invention.

Figure 4:
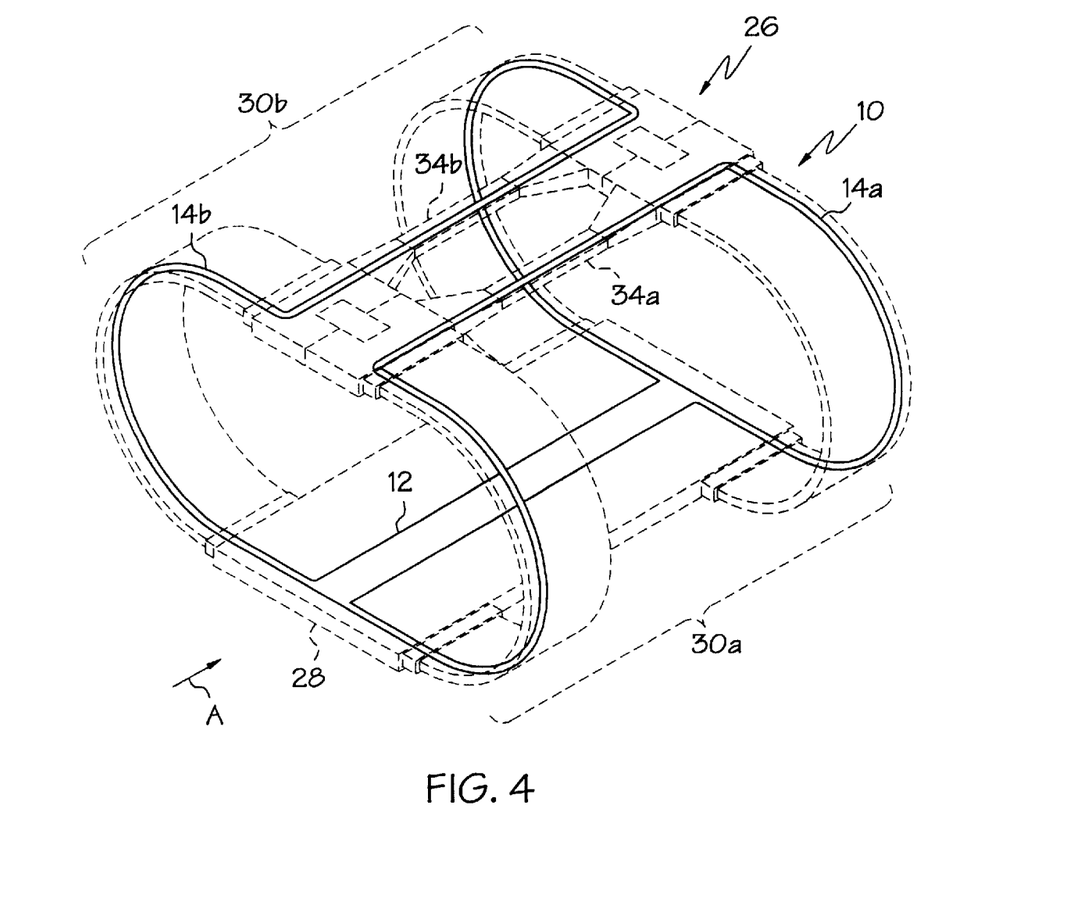
FIG. 4 provides a perspective view of a saddle coil housed within the harness of FIG. 3.

As shown in FIG. 4, a saddle coil 10 is housed within the harness 26 such that the base or common segment 12 extends along the rectangular base 28 and such that the wing portions 14a, 14b extend separately along a respective pair of the arms 30a, 30b and into their associated cross bars 34a, 34b. Accordingly, the saddle coil 10 is oriented within the harness 26 such that the axis of its loops (wings) are substantially perpendicular to the patient or harness axis A. In more detail, the common segment 12 extends along the base 28. Wing segment 14a extends from the common segment 12, along one arm member of pair 30a to and along the cross bar 34a, and along the other arm member of pair 30a back to the common segment 12. Wing segment 14b extends from the common segment 12, along one arm member of pair 30b to and along the cross bar 34b, and along the other arm member of pair 30b back to the common segment 12.

Figure 5:
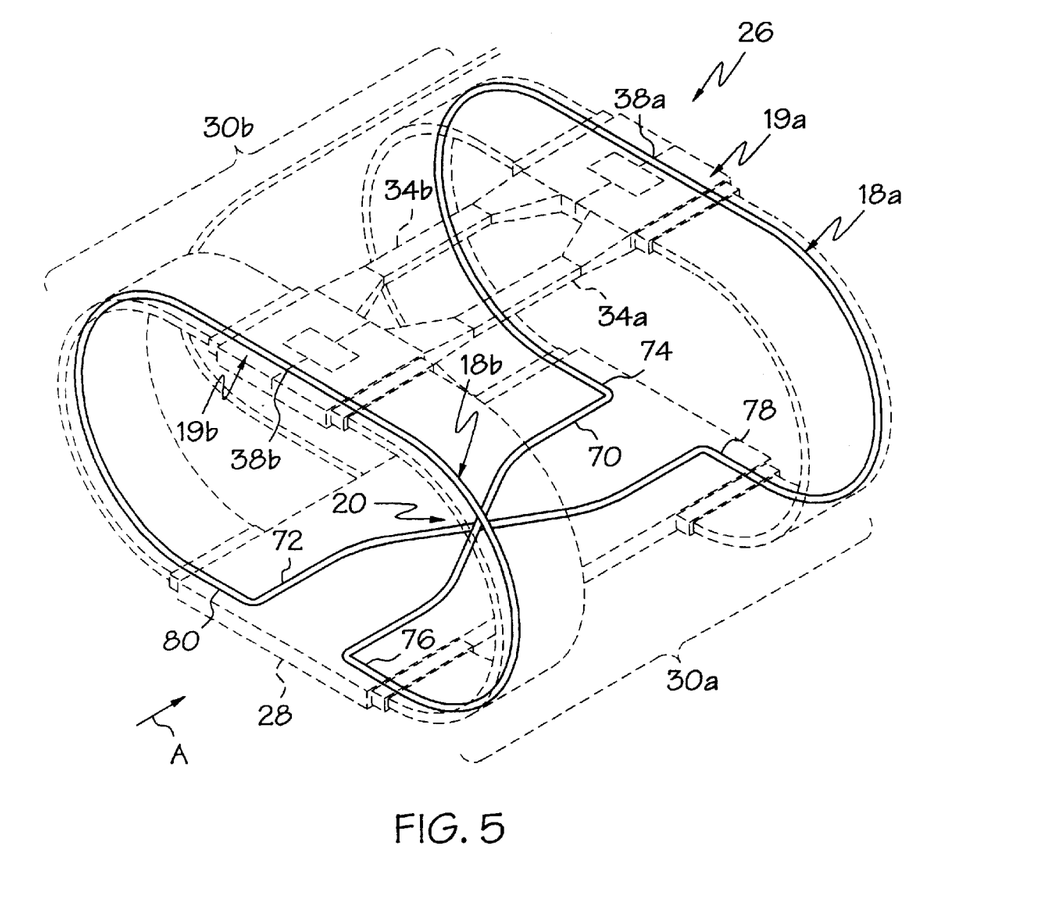
FIG. 5 provides a perspective view of a solenoid coil housed within the harness of FIG. 3.

As shown in FIG. 5, the solenoid coil 16 is housed within the harness 26 such that the crossover point 20 resides within the base 28 and such that each loop 18a, 18b is positioned in a separate harness loop 19a, 19b formed by the opposing, detachably connected flexible arms. As shown in FIGS. 2 and 5, each of the individual loops 18a, 18b are formed by two segments which are separable, and can be electrically connected together at point 38a, 38b. Accordingly, the two-turn solenoid coil 16 is oriented such that the axis of its loops are substantially parallel to the patient or harness axis A. Two distinct conductive segments 70, 72 extend along base 28 for electrically connecting the loops 18a, 18b. The distinct conductive segments 70, 72 overlap at point 20 but are not in electrically conductive contact with each other at such point 20. Thus, a side 74 of loop 18a at one side of the base 28 is electrically connected to a side 76 of loop 18b at an opposite side of the base 28 by segment 70. Similarly, side 78 of loop 18a is electrically connected to side 80 of loop 18b by segment 72.

It will be apparent to those who are skilled in the art that both the saddle coil 10 and the two-turn solenoid coil 16 are both housed within the same coil harness 26, however, they are illustrated separately in FIGS. 4 and 5 for clarity. The harness may be constructed of any suitable non-ferromagnetic material which is stiff enough to hold the general shape but preferably also flexible enough to allow for some movement of the arms. For example, a molded plastic or other polymeric material could be utilized for the harness skeleton and the coils could be run along the surface of the plastic or within channels formed in or machined into the plastic. The harness skeleton with coils could then be covered with a material such a vinyl to isolate the coils from the patient. It is recognized that other materials could be utilized for the harness skeleton and the covering.

Figure 6:
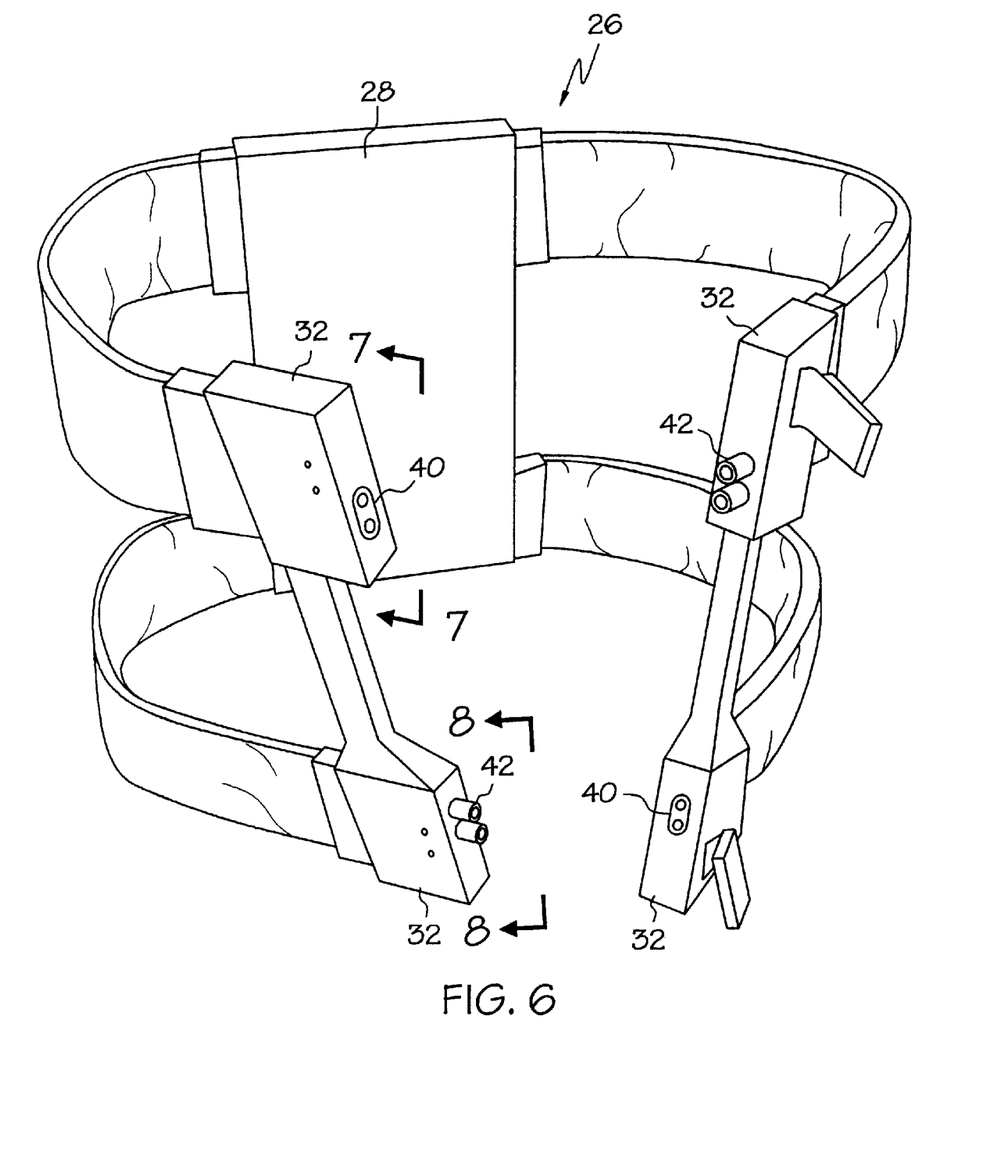
FIG. 6 provides a perspective view of the harness of FIG. 3 in an open position.
Figure 7:
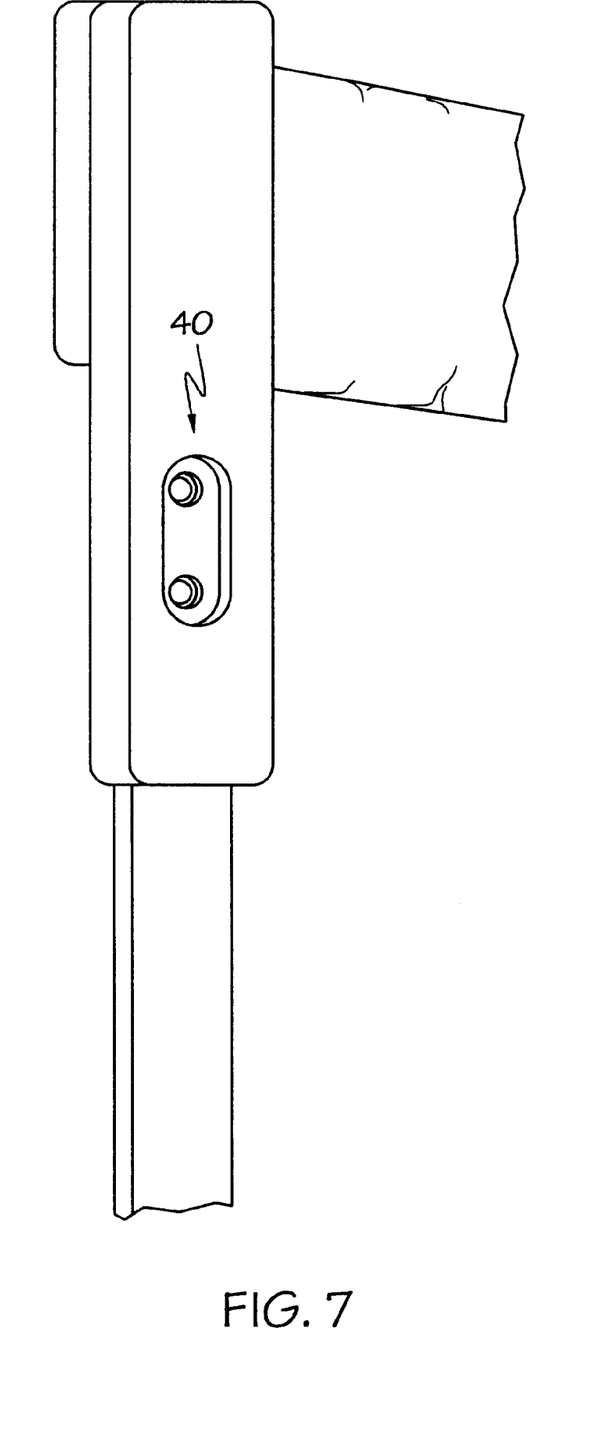
FIG. 7 provides an enlarged perspective view of one connecting portion of the harness of FIG. 6.
Figure 8:
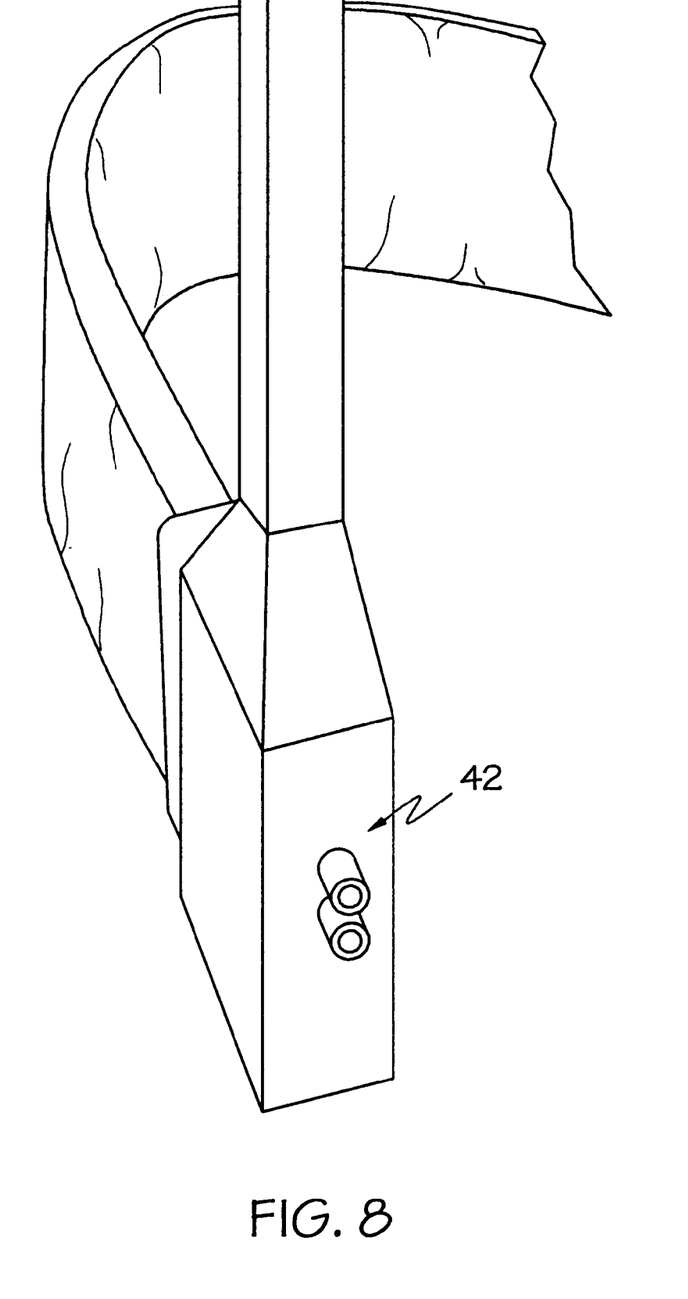
FIG. 8 provides an enlarged perspective view of another connecting portion of the harness of FIG. 6.

Referring back to FIG. 3, the base 28, in addition to housing portions of the saddle coil 10 and two-turn solenoid coil 16, includes other circuitry necessary for operation of the coils and includes the signal-out lines 22, 24 which exit the base 28 through cable 40. As shown in FIGS. 6–8, illustrating the harness 26 in an open position, the solenoid loops 18a, 18b are coupled together at points 38a, 38b with positive and negative leads (pin and socket type connectors) 40, 42, respectively. It will be apparent to those of ordinary skill in the art that there are many other electronic couplings/connectors that are suitable for the same purpose.

Although the present embodiment is for use as a spine/body coil harness, other embodiments of the invention can be sized for use with different portions of the patient's anatomy. Additionally, the coils and harness can be modified for use in different size patients to optimize the signal to noise ratio according to the body diameter. Accordingly, although the dimensions specified herein are preferred for a body harness, it is recognized that such dimensions may vary widely, particularly where a similar harness is constructed for a smaller portion of anatomy such as an arm or leg. Still further, although arm members which extend from opposite sides of the base are preferably aligned and detachably connected to form loops, a coil assembly withing the scope of the present invention could be constructed with a harness having arm members extending from opposite sides of the base where the arm members connect to each other in a permanent manner or are formed integral with each other.

It is also recognized and within the scope of the invention that the arms may be substantially rigid, as opposed to flexible. It is further within the scope of the invention that a four turn solenoid coil replace the two turn solenoid coil. Such a coil would have two sets of two solenoid turns. Each set would be positioned close together (2 to 5 cm) within one of the flexible arms while the sets would be spaced apart at 15 to 20 cm. Similarly, other coil types and configurations may be established using the harness of the present invention.

Figure 9:
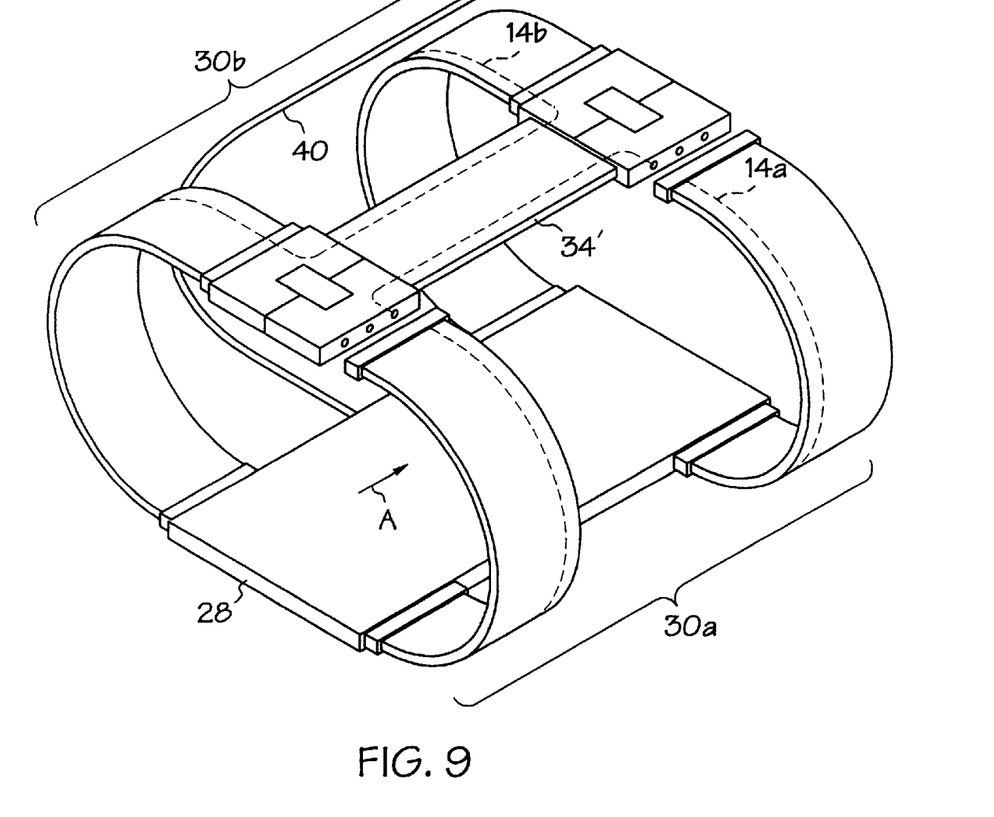

Referring to FIG. 9, an alternative embodiment of the present invention is shown in which only one cross member 34' is provided between the pair of arms 30b. Pair of arms 30a connects to the pair of arms 30b in a similar manner as described previously, except that an additional electrical connection is provided at the detachable interface to provide a link which completes wing portion 14a of the quadrature coil. Thus, when connected in operable fashion both wing portions 14a and 14b include a segment which extends along the single cross member 34'. It is also understood that the single cross member could be formed with a central opening if desired. Further, two distinct cross members could likewise be provided between one set of parallel arms without departing from the scope of the present invention.

While the forms and apparatus herein described constitute preferred embodiments of this invention, it is to be understood that the invention is not limited to these precise forms of apparatus, and that changes may be made therein without departing from the scope of the invention.

What is claimed is:

1. An MRI coil assembly comprising:
    a harness including a base, first and second spaced apart arm members extending from a first side portion of said base and above and over said base, third and fourth spaced apart arm members extending from a second side portion of said base and above and over said base, a first cross member extending between said first arm member and said second arm member, and a second cross member extending between said third arm member and said fourth arm member, wherein said first arm member is aligned with and detachably connected to said third arm member, and wherein said second arm member is aligned with and detachably connected to said fourth arm member;
    a first coil member extending along said harness and including a common segment extending along said base, a first wing segment extending from said common segment, along said first arm member to and along said first cross member, and along said second arm member back to said common segment, and a second wing segment extending from said common segment, along said third arm member to and along said second cross member, and along said fourth arm member back to said common segment; and
    a second coil member extending along said harness and including at least first and second loops, said first loop extending generally along said first arm member and said third arm member and said second loop extending generally along said second arm member and said fourth arm member, said first and second loops being electrically connected.

2. The MRI coil assembly of claim 1 wherein said first and second arm members extend substantially parallel to each other and wherein said third and fourth arm members extend substantially parallel to each other.

3. The MRI coil assembly of claim 2 wherein said first and second arm members are axially spaced at least 15 cm from each other and wherein said third and fourth arm members are axially spaced at least 15 cm from each other.

4. The MRI coil assembly of claim 3 wherein said first side portion of said base is circumferentially spaced at least 125 degrees from said first cross member and wherein said second side portion of said base is circumferentially spaced at least 125 degrees from said second cross member.

5. The MRI coil assembly of claim 1 wherein said first and second cross members extend substantially parallel to each other.

6. The MRI coil assembly of claim 1 wherein said first loop of said second coil member is formed by a first segment extending along said first arm member and a second segment extending along said third arm member, said assembly further comprising first and second mating electrical connectors positioned at respective end portions of said first and third arm members for electrically connecting said first and second segments.

7. The MRI coil assembly of claim 6 wherein said second loop of said second coil member is formed by a third segment extending along said second arm member and a fourth segment extending along said fourth arm member, said assembly further comprising third and fourth mating electrical connectors positioned at respective end portions of said first and third arm members for electrically connecting said third and fourth segments.

8. The MRI coil assembly of claim 1 wherein said first coil member comprises a saddle coil and wherein said second coil member comprises a solenoid coil.

9. The MRI coil assembly of claim 1 wherein each of said first, second, third, and fourth arm members is flexible.

10. The MRI coil assembly of claim 1 wherein said first coil member includes an output and said second coil member includes an output, said MRI coil assembly further comprising at least one conductor operatively connected to each of said outputs and extending from said harness.

11. The MRI coil assembly of claim 1 wherein said first and second arm members extend substantially parallel to each other and wherein said third and fourth arm members extend substantially parallel to each other, and said first and second arm members are axially spaced about 15–25 cm from each other and said third and fourth arm members are axially spaced about 15–25 cm from each other.

12. A coil assembly for use in MRI imaging, said coil assembly comprising:
a harness including a base, first and second spaced apart arm members extending from a first side of said base and above and over said base, third and fourth spaced apart arm members extending from a second side of said base and above and over said base, a first cross member extending between said first arm member and said second arm member, and a second cross member extending between said third arm member and said fourth arm member, wherein an end of said first arm member is aligned with and detachably connected to an end of said third arm member, and wherein an end of said second arm member is aligned with and detachably connected to an end of said fourth arm member;
a first coil member extending along said harness; and
a second coil member extending along said harness.

13. An MRI coil assembly, comprising:
a harness including a longitudinal axis, a first structural loop extending generally orthogonal to said longitudinal axis, a second structural loop axially spaced from said first structural loop and extending generally orthogonal to said longitudinal axis, at least one cross bar extending generally parallel to said longitudinal axis and between said first and second structural loops, and a base extending between said first and second structural loops;
a first coil member extending along said harness; and
a second coil member extending along said harness.

14. The MRI coil assembly of claim 13 wherein said first coil member includes a common segment extending along said base, a first wing segment extending from said common segment partially along said first structural loop at a first side thereof to and along said at least one cross bar, and partially along said second structural loop at a first side thereof back to said common segment, and a second wing segment extending from said common segment partially along said first structural loop at a second side thereof to and along said at least one cross bar, and partially along said second structural loop at a second side thereof back to said common segment.

15. The MRI coil assembly of claim 13 wherein said second coil member comprises a first conductive loop extending along said first structural loop and a second conductive loop extending along said second structural loop, a first side of said first conductive loop at a first side of said base electrically connected along said base to a second side of said second conductive loop at a second side of said base, and a second side of said first conductive loop at said second side of said base electrically connected along said base to a first side of said second conductive loop at said first side of said base.

16. The MRI coil assembly of claim 13 wherein said first coil member is a saddle coil and wherein said second coil member is a solenoid coil including at least two conductive loops, said MRI coil assembly comprising a quadrature coil assembly.

17. The MRI coil assembly of claim 13 wherein said first and second structural loops of said harness are axially spaced about 15–25 cm from each other.

18. The MRI coil assembly of claim 13 wherein said first structural loop is formed by first and second aligned and detachably connected arm members extending from opposite sides of said base, and wherein said second structural loop is formed by third and fourth detachably connected arm members extending from opposite sides of said base.

19. The MRI coil assembly of claim 13 wherein said at least one cross member comprises a first cross member extending between said first and second structural loops and a second cross member extending between said first and second structural loops.

20. The MRI coil assembly of claim 13 wherein said first and second structural loops are positioned toward opposite ends of the harness along its longitudinal axis providing a spacing between said first and second loops in a central portion of the harness.

* * * * *